United States Patent
Chen et al.

[11] Patent Number: 6,139,905
[45] Date of Patent: *Oct. 31, 2000

[54] INTEGRATED CVD/PVD AL PLANARIZATION USING ULTRA-THIN NUCLEATION LAYERS

[75] Inventors: Liang-Yuh Chen; Mehul Naik, both of San Jose; Ted Guo, Palo Alto; Roderick Craig Mosely, Pleasanton, all of Calif.

[73] Assignee: Applied Materials, Inc., Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/838,839

[22] Filed: Apr. 11, 1997

[51] Int. Cl.$^7$ ...................................................... B05D 5/12
[52] U.S. Cl. .................... 427/124; 427/126.1; 427/255.7
[58] Field of Search .................................. 427/255.7, 576, 427/124, 126.1, 250, 294, 404, 419.7, 585

[56] References Cited

U.S. PATENT DOCUMENTS

| | | |
|---|---|---|
| 4,784,973 | 11/1988 | Stevens et al. . |
| 5,032,233 | 7/1991 | Yu et al. . |
| 5,080,933 | 1/1992 | Grupen et al. . |
| 5,091,339 | 2/1992 | Carey . |
| 5,147,819 | 9/1992 | Yu et al. ................................. 437/173 |

(List continued on next page.)

FOREIGN PATENT DOCUMENTS

| | | | |
|---|---|---|---|
| 0 794 568 A2 | 9/1997 | European Pat. Off. ...... | H01L 21/768 |
| 0 794 568 A3 | 9/1997 | European Pat. Off. ...... | H01L 21/768 |
| 3743591A1 | 7/1988 | Germany . | |
| 195 22 660 A1 | 4/1998 | Germany ........................ | H01L 23/52 |
| 8-10693 | 1/1986 | Japan . | |
| 63-9925 | 7/1988 | Japan . | |
| 7-226387 | 8/1995 | Japan .............................. | H01L 21/88 |

OTHER PUBLICATIONS

European Search Report dated May 27, 1999.
Yosi Shacham–Diamand, "100nm Wide Copper Lines Made by Selective Electroless Deposition," J. Micromech. Microeng, Mar. 1, 1991, vol. 1. No. 1, pp. 66–72.
Li, et al., "Copper Deposition and Thermal Stability Issues in Copper–Based Metalization for ULSI Technology," Materials Science Reports, 1992, Vol. 9, pp. 1–51.
K. Mikagi, H. Ishikawa, T. Usami, M. Suzuki, K. Inoue, N. Oda, S. Chikaki, I. Sakai and T. Kikkawa, "Barrier Metal Free Copper Damascene Interconnection Technology Using Atmospheric Copper Reflow and Nitrogen Doping in SiOF Film," 1996 IEEE, pp. 365–368.
Y. Shacham–Diamand, V. Dubin and M. Angyal, "Electroless Copper Deposition for ULSI," 1995 Elsevier Science S.A., pp. 93–103.

*Primary Examiner*—Diana Dudash
*Assistant Examiner*—Paul D. Strain
*Attorney, Agent, or Firm*—Thomason, Moser & Patterson, LLP

[57] ABSTRACT

The present invention provides a method and apparatus for forming an interconnect with application in small feature sizes (such as quarter micron widths) having high aspect ratios. Generally, the present invention provides a method and apparatus for depositing a wetting layer for subsequent physical vapor deposition to fill the interconnect. In one aspect of the invention, the wetting layer is a metal layer deposited using either CVD techniques or electroplating, such as CVD aluminum (Al). The wetting layer is nucleated using an ultra-thin layer, denoted as ∈ layer, as a nucleation layer. The ∈ layer is preferably comprised of a material such as Ti, TiN, Al, Ti/TiN, Ta, TaN, Cu, a flush of TDMAT or the like. The ∈ layer may be deposited using PVD or CVD techniques, preferably PVD techniques to improve film quality and orientation within the feature. Contrary to conventional wisdom, the ∈ layer is not continuous to nucleate the growth of the CVD wetting layer thereon. A PVD deposited metal is then deposited on the wetting layer at low temperature to fill the interconnect.

19 Claims, 5 Drawing Sheets

U.S. PATENT DOCUMENTS

| | | |
|---|---|---|
| 5,240,739 | 8/1993 | Doan et al. . |
| 5,292,558 | 3/1994 | Heller et al. . |
| 5,308,796 | 5/1994 | Feldman et al. . |
| 5,312,774 | 5/1994 | Nakamura et al. . |
| 5,354,712 | 10/1994 | Ho et al. . |
| 5,420,072 | 5/1995 | Fiordalice et al. ............... 437/192 |
| 5,429,991 | 7/1995 | Iwasaki et al. . |
| 5,480,836 | 1/1996 | Harada et al. . |
| 5,514,425 | 5/1996 | Ito et al. . |
| 5,523,259 | 6/1996 | Merchant et al. ............... 437/190 |
| 5,565,819 | 10/1996 | Ohsaki et al. ............... 257/764 |
| 5,582,881 | 12/1996 | Besser et al. ............... 427/576 |
| 5,585,308 | 12/1996 | Sardella . |
| 5,585,673 | 12/1996 | Joshi et al. . |
| 5,627,102 | 5/1997 | Shinriki et al. ............... 437/192 |
| 5,654,232 | 8/1997 | Gardner ............... 438/661 |
| 5,712,193 | 1/1998 | Hower et al. ............... 437/187 |
| 5,804,251 | 9/1998 | Yu et al. ............... 427/250 |
| 5,858,873 | 1/1999 | Vitkavage et al. ............... 438/626 |

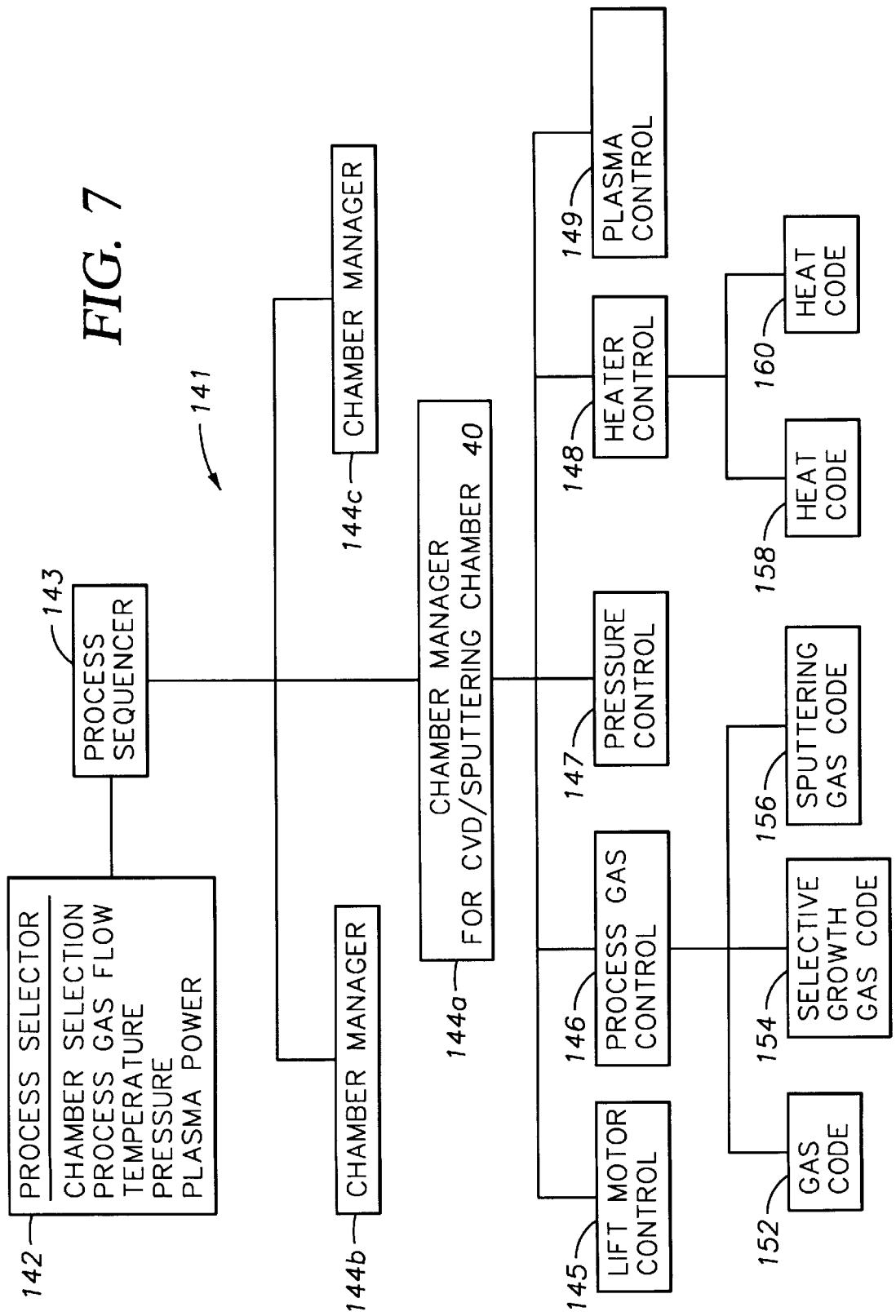

INTEGRATED CVD/PVD AL PLANARIZATION USING ULTRA-THIN NUCLEATION LAYERS

FIELD OF THE INVENTION

The present invention relates to an apparatus and method for forming integrated plug and wire interconnects for small (sub-quarter micron) features having high aspect ratios. More particularly, the present invention provides an in-situ metallization sequence for forming metal interconnects comprising depositing a thin nucleation layer to nucleate the deposition of a continuous wetting layer on which via fill is then carried out.

BACKGROUND OF THE INVENTION

Sub-half micron multilevel metallization is one of the key technologies for the next generation of very large scale integration ("VLSI"). The multilevel interconnects that lie at the heart of this technology require planarization of high aspect ratio features such as plugs and other interconnects. Reliable formation of these interconnects is very important to the success of VLSI and to the continued effort to increase circuit density and quality on individual substrates and die.

Conventional chemical vapor deposition (CVD) and physical vapor deposition (PVD) techniques are used to deposit electrically conductive material into the contact holes and vias formed on the substrate. One problem with conventional processes arises because the contact holes or vias often comprise high aspect ratios, i.e., the ratio of the height of the holes to their width or diameter is greater than 1. The aspect ratio of the holes increases as advances in technology yield more closely spaced features.

Referring to FIG. 1, a substrate 10 includes a hole 11 formed within an electrically insulative or dielectric layer 12 thereon, such as for example, a silicon dioxide or silicon nitride layer. It is difficult to deposit a uniform metal-containing layer into the high aspect ratio hole 11 because the metal-containing layer often deposits on the sidewalls 14 of the holes and across the width of the hole to eventually converge across the width of the hole before it is completely filled, and thus forms voids and discontinuities within the metal-containing material. Thereafter, the high mobility of metal atoms, surrounding the voids causes the atoms to diffuse and minimize the surface area of the voids forming circular shaped voids as shown in FIG. 1. These voids and discontinuities result in poor and unreliable electrical contacts.

One method used to reduce the likelihood that voids will form in the vias is to "planarize" the metal at high temperatures. Formation of a continuous wetting layer on the substrate is the key for successful planarization at high temperatures. It has been discovered that a thin conformal aluminum film is a good wetting layer for subsequent physical vapor deposition and planarization techniques performed at high temperature ($\geq 350°$). This discovery is disclosed in co-pending U.S. patent application Ser. No. 08/561,605, now U.S. Pat. No. 5,877,087, entitled "Low Temperature Integrated Metallization Process and Apparatus" which was filed on Nov. 21, 1996, and is commonly assigned to Applied Materials, Inc. One method disclosed in that application is the use of a wetting layer deposited using chemical vapor deposition techniques, i.e., an aluminum layer, as the planarization wetting layer. It was believed prior to the present invention that to deposit a thin conformal wetting layer in the via, it was necessary to first deposit a conformal nucleation layer. The use of thin nucleation layers is disclosed in U.S. patent applications Ser. No. 08/620,405, pending entitled "Single Step Process for Blanket-Selective CVD Aluminum Deposition; U.S. patent application Ser. No. 08/622,941, pending entitled "Blanket-Selective Deposition of CVD Aluminum and Reflectivity Improvement Using a Self-Aligning Ultra-Thin Layer"; and U.S. Pat. No. 08/561,605, now U.S. Pat. No. 5,877,087, entitled "Single Step Process for Blanket Selective CVD Al Deposition", and commonly assigned to Applied Materials, Inc.

Another problem associated with Al interconnects is the formation of $TiAl_3$ in applications where Ti is deposited as an underlayer before Al deposition. Ti has a propensity to bind Al and form $TiAl_3$ which is an insulator thereby compromising the performance of an interconnect. One solution to prevent $TiAl_3$ formation is to follow deposition of a Ti layer with deposition of a TiN layer. This reduces the amount of Ti available to bind Al. While this sequence provides a possible solution in some applications, as feature sizes decrease the need to reduce the thickness of any underlayers increases.

Thus, there is a need for a process to fill high aspect ratio contact holes and vias in a substrate without forming voids or defects in the deposited material. It is also desirable for the deposition process to deposit grains that are highly oriented in particular crystallographic planes.

SUMMARY OF THE INVENTION

The present invention provides a method and apparatus for forming an interconnect with application in small feature sizes (such as quarter micron widths and smaller) and which may have high aspect ratios. Generally, the present invention provides a method and apparatus for depositing a non-continuous, thin nucleation layer on which a conformal wetting layer can be formed. Next, the via is filled to complete the interconnect. The wetting layer has been found to enhance via fill by facilitating flow of the material deposited thereon.

In one aspect of the invention, the nucleating layer comprises a non-continuous, thin layer of from about a few atoms to about a few hundred Å and is denoted hereinafter as an $\in$ layer. The wetting layer is preferably a metal layer, such as an aluminum (Al) or copper (Cu) layer, deposited using chemical vapor deposition techniques or electroplating techniques. The $\in$ layer is preferably comprised of a material such as Ti, TiN, Al, Ti/TiN, Ta, TaN, Cu or a flash of tetracus dimethyl amino titanium (TDMAT). The $\in$ layer may be deposited using PVD or CVD techniques, preferably PVD techniques to improve film quality and crystal orientation of the resulting feature. Contrary to current practice, we have discovered that the $\in$ layer does not have to be entirely conformal or continuous to nucleate the growth of the wetting layer, thereby providing a wider process window and extending the capability of CVD/PVD integration technology to smaller feature sizes.

In another aspect of the invention, the $\in$ layer promotes formation of a highly oriented film which has better texture than films deposited on continuous liner films. The $\in$ layer promotes orientation and morphology of the film by producing a self-aligning effect in the film being deposited on the $\in$ layer. In addition, the use of a thin liner, such as TiN or Ti, prevents or minimizes the interaction of Ti and Al, thereby reducing $TiAl_3$ formation which inhibits the performance of the device.

In still another aspect, the present invention provides a control system for operating a process system for forming an interconnect by first depositing a thin nucleation film on which a conformal wetting layer is deposited and which enhances the flow of material deposited in the feature on the wetting layer. The computer product comprises a computer usable medium having computer readable program code means. The computer code means comprises:

(a) substrate positioning code for positioning the substrate in one or more chambers;

(b) heater control code for operating a heater in a selected chamber; and (c) process gas control for conducting a process comprising the steps of: (i) in a PVD or CVD chamber depositing a thin nucleation film, (ii) in a CVD chamber, introducing one or more deposition gases into a process zone to deposit a metal-containing wetting layer, and (iii) in a PVD chamber, introducing a sputtering gas into a chamber having a metal-containing material disposed therein to deposit a metal-containing film.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefor not to be considered limiting of its scope, for the invention may admit to other equally effective embodiments.

FIG. 7 is a simplified block diagram showing the hierarchical control structure of a computer program of the present invention.

DETAILED DESCRIPTION OF THE INVENTION

Figure 1:
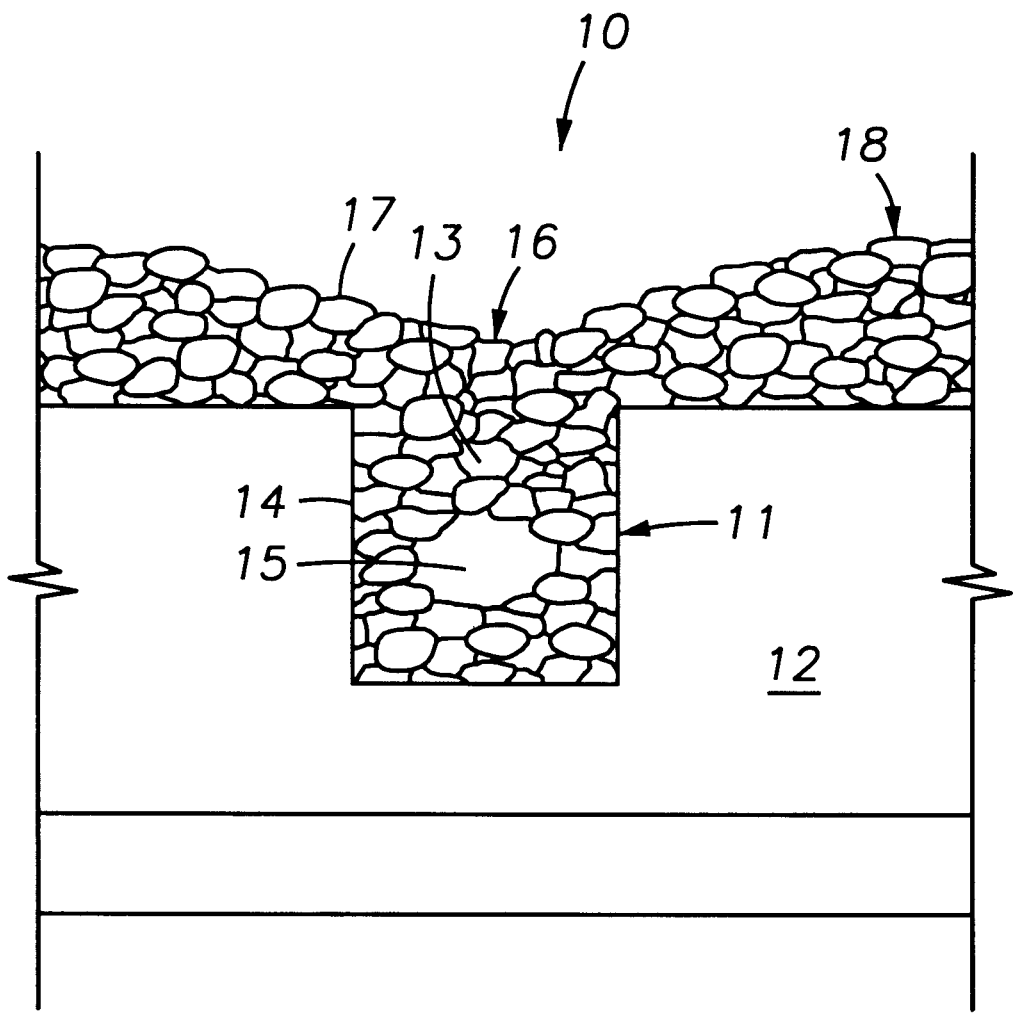
FIG. 1 is a schematic partial sectional view of a prior art substrate showing a randomly-oriented, fine-grained, granular deposition layer in an etched contact hole in the substrate with voids, discontinuities and a non-planar surface.

The present invention provides a method and apparatus to form plug and interconnects for small feature sizes, such as quarter micron widths which typically have high aspect ratios. Generally, the present invention provides a process for forming a plug or interconnect by growing a generally continuous or conformal wetting layer on a non-continuous nucleation film, denoted as an $\in$ layer. A metal film is then deposited on the wetting layer, preferably at low temperature, e.g., $\leq 380°$ C., to fill the plug and form the interconnect.

In one aspect of the invention, an ultra-thin $\in$ layer comprised of Ti, TiN, Al, Ti/TiN, Ta, TaN, Cu, a flash of TDMAT or the like is deposited on a patterned surface of a substrate to form the nucleation film. The $\in$ layer may be deposited using PVD or CVD techniques, preferably PVD techniques to provide a self aligning layer on which a highly oriented film can be grown. Contrary to current practice, the $\in$ layer does not have to be entirely continuous or conformal to nucleate the growth of the wetting layer. Next, a wetting layer, such as aluminum (Al), copper (Cu) or other conducting material, is deposited using chemical vapor deposition techniques or electroplating to provide a generally conformal wetting layer. A metal layer, such as Al or Cu, is then deposited at low temperature, e.g., $\leq 380°$ C., on the wetting layer preferably using physical vapor deposition techniques. However, chemical vapor deposition, electroplating or other metal deposition technique known in the field may be used.

In a process commonly referred to as warm metal planarization, a continuous wetting layer is the key to achieving good conformal coverage. The inventors have discovered that a continuous layer of a metal, such as Al or Cu, grows on a monolayer of a preferred nucleation material such as Ti, TiN, Al, Ti/TiN, Ta, TaN, Cu, a flash of TDMAT, or the like. In one aspect of the invention, the $\in$ layer is a dis-continuous film inside the via to nucleate CVD deposition or electroplating, thereby providing a wider process window and extending the capability of integration technology because a continuous nucleation layer is unnecessary. As feature sizes shrink, the area which must be filled with the metal shrinks as more layers are required in a process sequence to nucleate the deposition of the metal. It has been earlier discovered that a thin, continuous metal film, such as CVD Al or Cu, is a good wetting layer which aides the filling or flow process used in warm PVD metal deposition resulting in a low temperature ($\leq 380°$ C.) deposition process as disclosed in co-pending U.S. patent application Ser. No. 08/561,605 now U.S. Pat. No. 5,877,087, entitled "Low Temperature Integrated Metallization Process and Apparatus" and commonly assigned to Applied Materials, Inc. In small feature sizes, a thick nucleation layer increases the possibility that the opening to the interconnect will converge or that the deposition material on the sidewall of the interconnect will converge thereby leaving a void in the interconnect.

Figure 2:
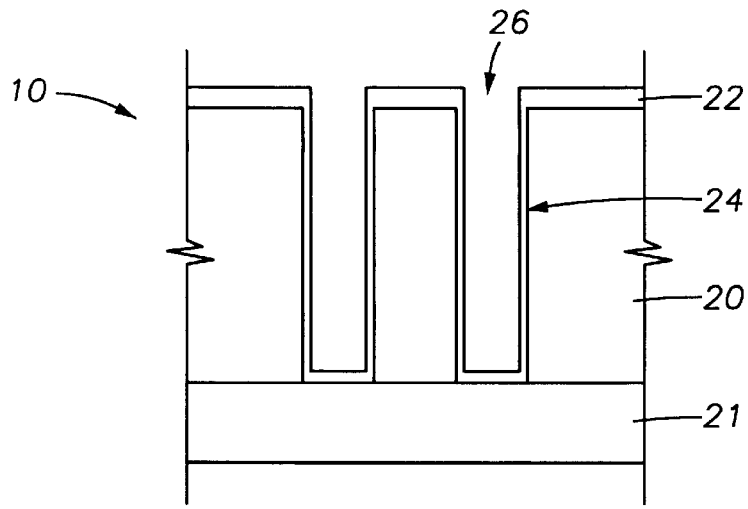
FIG. 2 is a schematic partial sectional view of a substrate processed according to the present invention showing a thin nucleation layer deposited on the substrate.
Figure 3:
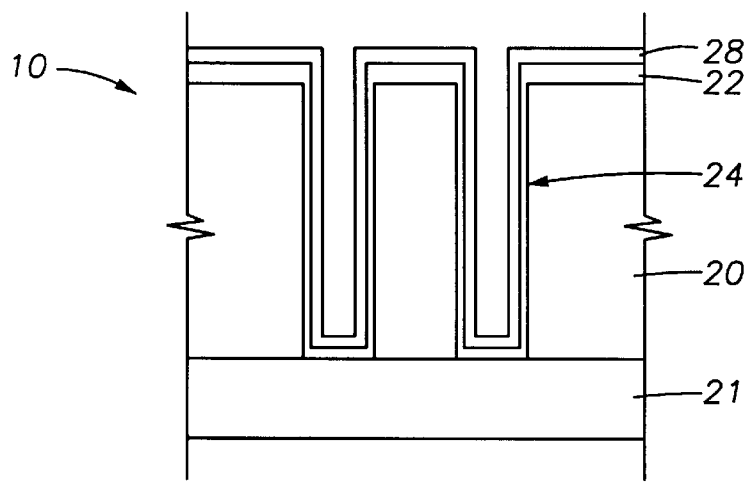
FIG. 3 is a schematic partial sectional view of the substrate of FIG. 2 showing a conformal wetting layer deposited on the substrate.
Figure 4:
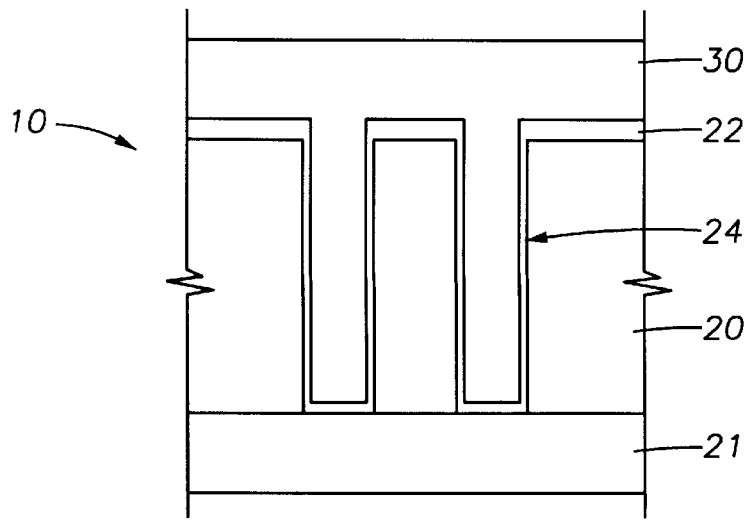
FIG. 4 is a schematic partial sectional view of the substrate of FIG. 3 showing a metal deposited at low temperature on the conformal wetting layer.

FIGS. 2–4 show a cross sectional view of a patterned dielectric 20, such as $SiO_2$, formed on a substrate 21 having the sequential steps of the present invention formed thereon. In accordance with one aspect of the present invention, a thin $\in$ layer 22 is deposited on the field of the substrate and in the via 26. Contrary to conventional wisdom, the discontinuous $\in$ layer nucleates deposition of a continuous, conformal wetting layer and can be deposited using PVD techniques to improve film quality with minimum thickness. The $\in$ layer is selected from the group consisting of Ti, TiN, Ti/TiN, Al, Ta, TaN, Cu, a flash of TDMAT or other nucleating material known in the field, and is preferably a thin, PVD Cu layer. In Cu applications and contact applications where the underlying layer is silicon or doped silicon, a continuous barrier layer such as TiN, Ta or TaN is preferably deposited prior to depositing the nucleation layer to prevent diffusion of Cu, Al or other metal into the underlying layers. The barrier layer is preferably from about 50 Å to about 200 Å in thickness.

Next, a thin wetting layer 28, such as an Al or Cu layer deposited using a CVD technique such as a thermal CVD process or electroplating, is deposited on the field and in the vias to provide good bottom coverage and continuous step coverage in small apertures which may have high aspect ratios. The plugs are then filled using PVD or CVD techniques, preferably PVD techniques such as deposition of a warm PVD Al or Cu layer 30, to provide void-free, low resistivity interconnects. Preferably, the PVD technique is a warm (≦380° C.) metal deposition process which also provides planarization on the field of the structure.

The present invention provides at least the following advantages. First, the formation of $TiAl_3$ is minimized using an ultra thin, non-continuous Ti nucleation layer, or completely eliminated using a thin PVD TiN film, a thin CVD TiN film (e.g., about 250 Å to about 500 Å), a thin CVD TiN film on Ti (e.g., about 5 Å to about 50 Å) or TDMAT flash as the nucleation layer. The ultra-thin Ti nucleation layer reduces the amount of Ti available to react with a metal, such as Al, thereby reducing the formation of $TiAl_3$. The use of a thin, non-continuous TiN film as the nucleation layer further reduces the likelihood of $TiAl_3$ formation by binding the Ti with N, thereby eliminating any reaction of Ti with Al. Secondly, use of PVD Ti and/or TiN as a nucleation layer eliminates the need for a CVD chamber to deposit the nucleation layer for CVD metals such as Al or Cu. Additionally, PVD techniques for thin film deposition may be preferable because the resulting film is typically higher in purity than other films and PVD techniques are less costly. Thirdly, the process of the present invention is extendable to very small feature sizes partly because a continuous nucleation layer is not needed to nucleate deposition of the wetting layer, especially if high density plasma (HDP) deposition of Ti or TiN is used to deposit the nucleation layer because sidewall coverage in some HDP processes may be minimal. Ti is usually deposited first to ensure good bottom interface in the via and to reduce the effect of native oxides which may be in the via. TiN provides a good nucleation film, particularly for Al.

More specifically, the invention will be described below in reference to a method and apparatus to form an Al plug and interconnect. However, it is to be noted that the invention is not limited to the particular materials or processes described below. Other materials having similar properties and processes used to deposit these materials may be used to advantage in accordance with the spirit and scope of the invention. First, a thin nucleation layer 22 from about a few atoms to about 200 Å is deposited on a patterned substrate, typically having a dielectric layer exposed. The nucleation layer 22 is preferably comprised of Ti/TiN, but may be comprised of Ti, TiN, Al, a flash of TDMAT (i.e., exposing the wafer surface to TDMAT) or combinations thereof. The material may be deposited using CVD or PVD techniques, preferably PVD techniques to enhance the quality of the subsequent films deposited thereon. PVD techniques such as standard, collimated or ion metal plasma (IMP or high density plasma) can be used. IMP provides good bottom coverage in very small high aspect ratio features. The preferred nucleation layer sequence comprises anywhere from a monolayer up to about 200 Å of PVD Ti followed by deposition of anywhere from a monolayer up to about 200 Å of TiN thereon with a total combined thickness of up to about 400 Å. This nucleation layer does not have to be continuous, i.e. the entire patterned surface need not be covered with the nucleating material. A thin, non-continuous nucleating layer enables filling of very small vias.

Next, a CVD Al layer 28 is deposited on the nucleation layer using thermal decomposition of DMAH as the precursor gas. Preferably about 100 Å to about 2000 Å (depending on via size) of CVD Al is deposited conformally over the patterned surface to provide a continuous wetting layer 28 for subsequent via fill.

Next, a PVD Al layer 30, or other alloy, is deposited using a warm PVD technique at a substrate temperature less than about 380° C. so that warm Al is deposited on the substrate and then flowed into the vias. The PVD warm Al process is preferably a low temperature deposition process performed at a substrate temperature of less than 380° C. The PVD process is performed by heating the substrate to a temperature in the range of from about 250° C. to about 500° C. A pressure of from about 0.2 mTorr to about 10 mTorr is maintained and a noble gas such as argon is introduced at a flow of from about 5 sccm to about 80 sccm. A DC bias power of from about 100 W to about 20 KW is applied to the target, while the substrate support and the chamber walls are grounded. An aluminum target is sputtered for about 3000 Ws to about 600,000 Ws.

An AlCu film or other doped material may be deposited over the resulting metal layer to allow migration of the Cu or other dopant throughout the metal layer. The process sequence described herein is particularly suitable for depositing a layer of highly oriented crystals of electrically conductive material into high aspect ratio contact holes and vias etched through insulative layers (such as silicon oxide, phosphosilicate glass (PSG) or borophosphosilicate glass (BPSG) layers).

The preferred reaction for deposition of the CVD metal layer is the thermal reduction of DMAH according to the following equations:

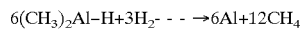

or

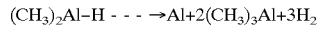

While Al is one preferred CVD metal layer, other metals such as copper (Cu) and the like may also be deposited in accordance with the methods of the present invention.

The TDMAT flash may be carried out by introducing TDMAT into the chamber at a flow rate of from about 10 sccm to about 200 sccm. The chamber pressure is preferably maintained at from about 0.2 Torr to about 2 Torr. The wafer is maintained at a temperature of from about 20° C. to about 450° C. for about a few seconds up to about two minutes or more while the TDMAT is flown into the chamber.

The ultra thin nucleation layer may be deposited on the substrate using techniques described in co-pending and commonly assigned U.S. patent application Ser. No. 08/622,941, to provide controlled deposition of the metal wetting layer on the field and to provide improved morphology and texture of the deposited metal layer, including the subsequent PVD metal layer. The thin, self-aligning nucleation layer 22, 24 can be deposited by sputtering a nucleation material, such as Ti, TiN, Al, Cu, Si, Nb, Ta, TaN, aluminum silicates, silica, high alumina and combinations thereof, for about 20–200 Ws to form nucleation sites on the field of the substrate and in the vias where nucleation of the subsequent CVD metal proceeds at a controlled rate and in a highly oriented manner. The self-aligning layer preferably is only scattered atoms or a thin blanket of nucleation material only a few Å thick.

The planarized metal PVD layer is preferably formed at a process temperature greater than about 150° C., most preferably greater than about 250° C., but less than about 380° C. To achieve the planarization of the metal film, the PVD metal film preferably immediately follows deposition of the wetting CVD metal film. The grain growth of the PVD metal layer formed at temperatures greater than about 250° C. exhibit grain growth which absorbs the nodules or other defects that are formed on the field of the substrate during CVD metal deposition to form a highly oriented metal blanket layer. The warm PVD metal layer may include trace amounts of copper or other dopant.

Figure 5:
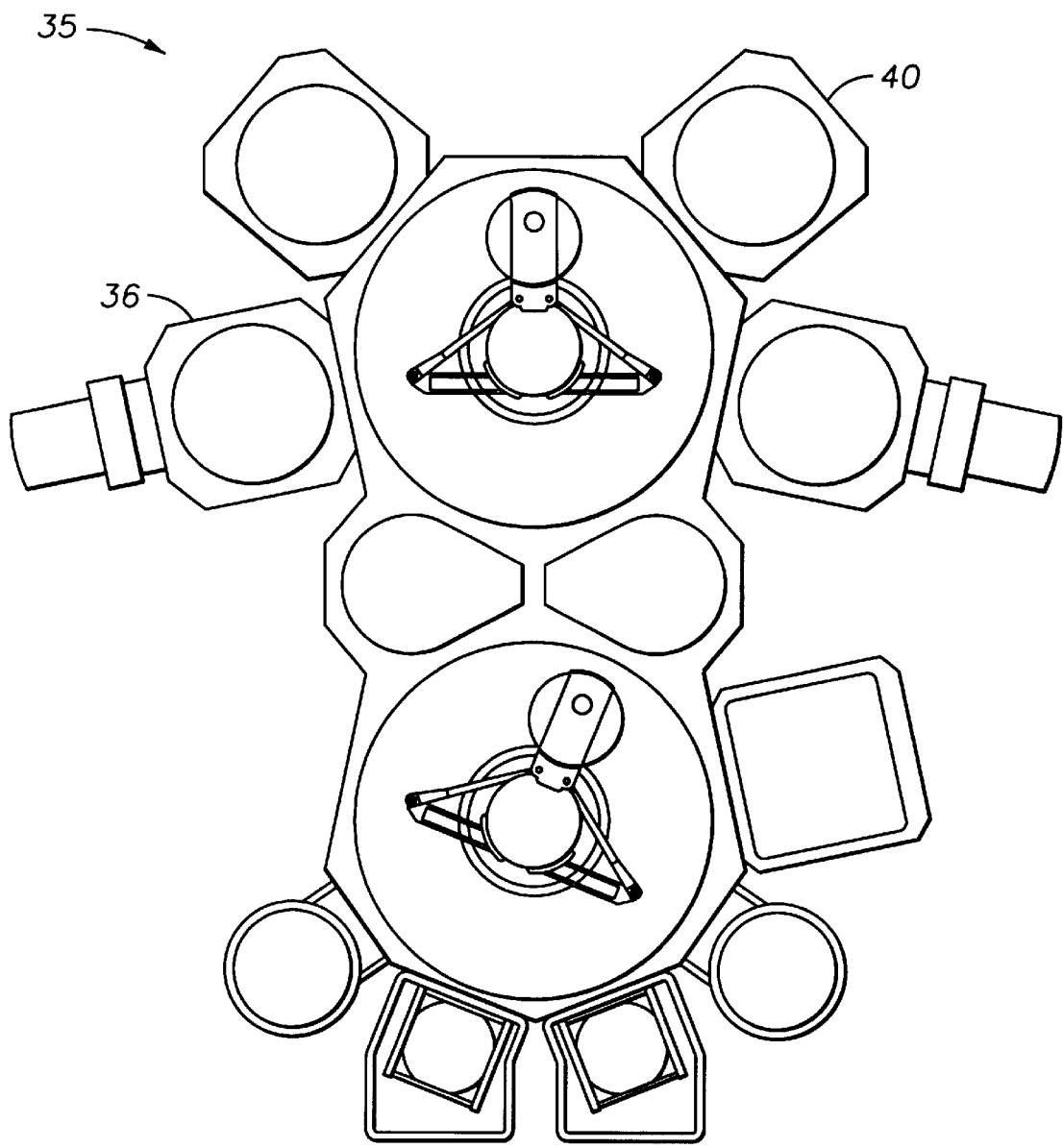
FIG. 5 is a schematic partial sectional view of an integrated multi-chamber apparatus suitable for performing CVD and PVD processes on a substrate.

A schematic of a multichamber processing apparatus 35 suitable for performing the CVD process of the present invention is illustrated in FIG. 5. The apparatus is an "ENDURA" system commercially available from Applied Materials, Inc., Santa Clara, Calif. The particular embodiment of the apparatus 35 shown herein is suitable for processing planar substrates, such as semiconductor substrates, and is provided to illustrate the invention, and should not be used to limit the scope of the invention. The apparatus 35 typically comprises a cluster of interconnected process chambers, for example, CVD and PVD deposition and rapid thermal annealing chambers.

The apparatus 35 includes at least one enclosed PVD deposition chamber 36 for performing PVD processes, such as sputtering. The PVD chamber 36 comprises a sputtering target (not shown) of sputtering material facing the substrate. The target is electrically isolated from the chamber and serves as a process electrode for generating a sputtering plasma. During the sputtering process, a sputtering gas, such as argon or xenon, is introduced into the chamber 36. A DC bias is applied to the sputtering target, and the support supporting the substrate in the chamber is electrically grounded. The resultant electric field in the chamber 36 ionizes sputtering gas to form a sputtering plasma that sputters the target causing deposition of material on the substrate. In sputtering processes, the plasma is typically generated by applying a DC or RF voltage at a power level of from about 100 to about 20,000 Watts, and more typically from about 100 to 10,000 Watts, to the sputtering target.

Figure 6:
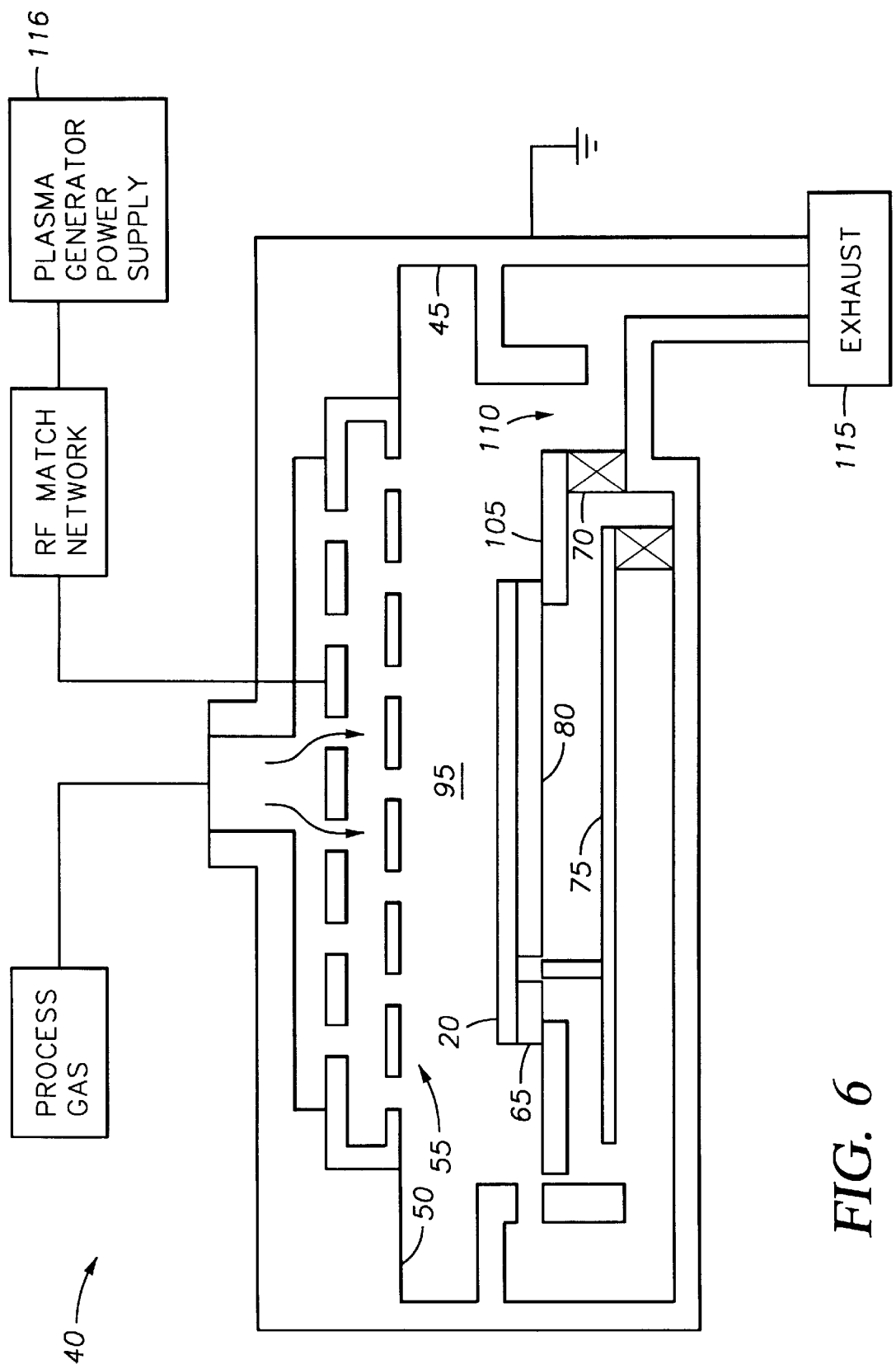
FIG. 6 is a schematic partial sectional view of a CVD deposition chamber suitable for performing a CVD deposition processes of the present invention.

The apparatus also comprises a CVD deposition chamber 40 (shown in FIG. 6) having surrounding sidewalls 45 and a ceiling 50. The chamber 40 comprises a process gas distributor 55 for distributing delivering process gases into the chamber. Mass flow controllers and air operated valves are used to control the flow of process gases into the deposition chamber 40. The gas distributor 55 is typically mounted above the substrate (as shown), or peripherally about the substrate (not shown). A support 65 is provided for supporting the substrate in the deposition chamber 40. The substrate is introduced into the chamber 40 through a substrate loading inlet in the sidewall 45 of the chamber 40 and placed on the support 65. The support 65 can be lifted or lowered by support lift bellows 70 so that the gap between the substrate and gas distributor 55 can be adjusted. A lift finger assembly 75 comprising lift fingers that are inserted through holes in the support 65 can be used to lift and lower the substrate onto the support to facilitate transport of the substrate into and out of the chamber 40. A thermal heater 80 is then provided in the chamber to rapidly heat the substrate. Rapid heating and cooling of the substrate is preferred to increase processing throughput, and to allow rapid cycling between successive processes operated at different temperatures within the same chamber 65. The temperature of the substrate is generally estimated from the temperature of the support 65.

The substrate is processed in a process zone 95 above a horizontal perforated barrier plate 105. The barrier plate 105 has exhaust holes 110 which are in fluid communication with an exhaust system 115 for exhausting spent process gases from the chamber 40. A typical exhaust system 115 comprises a rotary vane vacuum pump (not shown) capable of achieving a minimum vacuum of about 10 mTorr, and optionally a scrubber system for scrubbing byproduct gases.

The pressure in the chamber 40 is sensed at the side of the substrate and is controlled by adjusting a throttle valve in the exhaust system 115.

A plasma generator 116 is provided for generating a plasma in the process zone 95 of the chamber 40 for plasma enhanced chemical vapor deposition processes. The plasma generator 116 can generate a plasma (i) inductively by applying an RF current to an inductor coil encircling the deposition chamber (not shown), (ii) capacitively by applying an RF current to process electrodes in the chamber, or (iii) both inductively and capacitively while the chamber wall or other electrode is grounded. A DC or RF current at a power level of from about 750 Watts to about 2000 Watts can be applied to an inductor coil (not shown) to inductively couple energy into the deposition chamber to generate a plasma in the process zone 95. When an RF current is used, the frequency of the RF current is typically from about 400 KHz to about 16 MHZ, and more typically about 13.56 MHZ Optionally, a gas containment or plasma focus ring (not shown), typically made of aluminum oxide or quartz, can be used to contain the flow of process gas or plasma around the substrate.

Copper can be deposited on substrates to form lines and interconnects using electroless plating. First, a barrier layer is formed on a patterned substrate using a PVD or CVD method. The barrier layer is preferably comprised of TiN, Ta, TaN, AlO, WN, TiO, MgO, ternary materials such as $TiSi_xN_y$, $WSi_xN_y$, or $TaSi_xN_y$, or other materials known in the art. The barrier layer prevents the diffusion of Cu into the silicon dioxide or other dielectric. In addition, the barrier layer serves as a - ** nucleation layer on which the copper in the electroless plating process is grown. Once the substrate has a barrier layer and a nucleation layer formed thereon, the substrate is introduced into a plating bath where deposition proceeds. The copper is preferably deposited from a tetra-methyl-ammonium-hydroxide (TMAH)-containing solution. The components of one electroless deposition solution are presented below in Table 1.

TABLE 1

| Component | Function | Quantity (Ranges Only) |
| --- | --- | --- |
| $CuSO_4 5H_2O$ | Supply copper ions | 0.05–0.1 M |
| $N(CH_3)_4OH$ | Supply electrons | 0.05–1.0 M |
| EDTA | Complexing agent | 0.1 M |
| HCOH (or alternatively glyoxylic acid) | Reducing agent | 0.01–0.1 M |
| $N(CH_3)_4CN$ | complexing agent Affects morphology Surfactant | 0–0.01 M |
| GAF RE-610 | Reduces surface tension | 0.5–2% |

Copper deposited from a TMAH-containing solution has been found to yield good quality thin films with a resistivity as low as 1.7 $\mu\Omega$cm. This electroless plating deposition process is further described in a paper entitled "Electroless Copper Deposition for ULSI", Thin Solid Films 262 (1995) pp. 93–103.

The process can be implemented using a computer program product 141 that runs on a conventional computer system comprising a central processor unit (CPU) interconnected to a memory system with peripheral control components, such as for example a 68400 microprocessor, commercially available from Synenergy Microsystems, California. The computer program code can be written in any conventional computer readable programming language such as for example 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

FIG. 7 shows an illustrative block diagram of the hierarchical control structure of the computer program 141. A user enters a process set and process chamber number into a process selector subroutine 142. The process sets are predetermined sets of process parameters necessary to carry out specified processes in a specific process chamber, and are identified by predefined set numbers. The process set the desired process chamber, and (ii) the desired set of process parameters needed to operate the process chamber for performing a particular process. The process parameters relate to process conditions such as, for example, process gas composition and flow rates, temperature, pressure, plasma conditions such as RF bias power levels and magnetic field power levels, cooling gas pressure, and chamber wall temperature.

A process sequencer subroutine 143 comprises program code for accepting the identified process chamber and set of process parameters from the process selector subroutine 142, and for controlling operation of the various process chambers. Multiple users can enter process set numbers and process chamber numbers, or a user can enter multiple process set numbers and process chamber numbers, so the sequencer subroutine 143 operates to schedule the selected processes in the desired sequence. Preferably the sequencer subroutine 143 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer subroutine 143 can be designed to take into consideration the present condition of the process chamber being used in comparison with the desired process conditions for a selected process, or the "age" of each particular user entered request, or any other relevant factor a system programmer desires to include for determining scheduling priorities.

Once the sequencer subroutine 143 determines which process chamber and process set combination is going to be executed next, the sequencer subroutine 143 causes execution of the process set by passing the particular process set parameters to the chamber manager subroutines 144a–c which control multiple processing tasks in different process chambers according to the process set determined by the sequencer subroutine 143. For example, the chamber manager subroutine 144a comprises program code for controlling CVD process operations, within the described process chamber 40. The chamber manager subroutine 144 also controls execution of various chamber component subroutines or program code modules, which control operation of the chamber components necessary to carry out the selected process set. Examples of chamber component subroutines are substrate positioning subroutine 145, process gas control subroutine 146, pressure control subroutine 147, heater control subroutine 148, and plasma control subroutine 149.

These different subroutines function as seeding program code means for (i) heating the substrate to temperatures $T_s$ within a range of temperatures $\Delta T_s$, and (ii) introducing a reaction gases into the process zone to deposit a substantially continuous insulating layer on the field portions of the substrate; and deposition growth program code means for (i) maintaining the substrate at a deposition temperatures $T_d$ within a range of temperature $\Delta T_d$, and (ii) introducing deposition gas into the process zone to form an epitaxial growth layer that is grown in the contact holes or vias. Those having ordinary skill in the art would readily recognize that other chamber control subroutines can be included depending on what processes are desired to be performed in the process chamber 40.

In operation, the chamber manager subroutine 144a selectively schedules or calls the process component subroutines in accordance within the particular process set being executed. The chamber manager subroutine 144a schedules the process component subroutines similarly to how the sequencer subroutine 143 schedules which process chamber 40 and process set is to be executed next. Typically, the chamber manager subroutine 144a includes steps of monitoring the various chamber components, determining which components needs to be operated based on the process parameters for the process set to be executed, and causing execution of a chamber component subroutine responsive to the monitoring and determining steps.

Operation of particular chamber component subroutines will now be described. The substrate positioning code or subroutine 145 comprises program code for controlling chamber components that are used to load the substrate onto the chamber support 65, and optionally to lift the substrate to a desired height in the chamber 40 to control the spacing between the substrate and the gas distributor 55. When a substrate is loaded into the process chamber 40, the substrate support 65 is lowered to receive the substrate, and thereafter, the support is raised to the desired height in the chamber. The substrate positioning subroutine 145 controls movement of the support 65 in response to the process set parameters related to the support height that are transferred from the chamber manager subroutine 144a.

The process gas control subroutine 146 has program code for controlling process gas composition and flow rates. Generally, the process gases supply lines for each of the process gases, include (i) safety shut-off valves (not shown) that can be used to automatically or manually shut off the flow of process gas into the chamber, and (ii) mass flow controllers (also not shown) that measure the flow of a particular gas through the gas supply lines. When toxic gases are used in the process, the several safety shut-off valves are positioned on each gas supply line in conventional configurations. The process gas control subroutine 146 controls the open/close portion of the safety shut-off valves, and also ramps up/down the mass flow controllers to obtain the desired gas flow rate. The process gas control subroutine 146 is invoked by the chamber manager subroutine 144a, as are all chamber component subroutines, and receives from the chamber manager subroutine process parameters related to the desired gas flow rates. Typically, the process gas control subroutine 146 operates by opening the gas supply lines, and repeatedly (i) reading the necessary mass flow controllers, (ii) comparing the readings to the desired flow rates received from the chamber manager subroutine 144a, and (iii) adjusting the flow rates of the gas supply lines as necessary. Furthermore, the process gas control subroutine 146 includes steps for monitoring the gas flow rates for unsafe rates, and activating the safety shut-off valves when an unsafe condition is detected.

The process gas control subroutine 146 comprises deposition via program code for operating the chamber in a preferential field growth mode or a selective growth mode. In the preferential field growth stage, the reactant gas program code 152 flows reactant gas into the chamber 40 for an amount of time necessary to form a thin insulating layer on the substrate. Thereafter, in the selective deposition growth stage, the deposition gas program code 154 flows deposition gas into the chamber 40 for an amount of time necessary to grow the desired selective growth layer on the contact holes or vias and on the field. Sputtering gas program code 156 can also be provided to introduce sputtering gas into the PVD chamber 36 during performance of the PVD process step.

The process gas can be formed from a gas or liquid precursor. When a process gas is vaporized from a liquid precursor, for example dimethyl aluminum hydride (DMAH), the process gas control subroutine 146 is written to include steps for bubbling a carrier gas such as hydrogen, argon, or helium, through the liquid precursor in a bubbler assembly. For this type of process, the process gas control subroutine 146 regulates the flow of the carrier gas, the pressure in the bubbler, and the bubbler temperature in order to obtain the desired process gas flow rates. As discussed above, the desired process gas flow rates are transferred to the process gas control subroutine 146 as process parameters. Furthermore, the process gas control subroutine 146 includes steps for obtaining the necessary carrier gas flow rate, bubbler pressure, and bubbler temperature for the desired process gas flow rate by accessing a stored table containing the necessary values for a given process gas flow rate. Once the necessary values are obtained, the carrier gas flow rate, bubbler pressure and bubbler temperature are monitored, compared to the necessary values, and adjusted pressure in the chamber 40 by regulating the size of the opening of the throttle valve in the exhaust system 115 of the chamber. The opening size of the throttle valve is set to control the chamber pressure to the desired level in relation to the total process gas flow, size of the process chamber, and pumping setpoint pressure for exhaust system 115.

When the pressure control subroutine 147 is invoked, the desired or target pressure level is received as a parameter from the chamber manager subroutine 144a. The pressure control subroutine 147 operates to measure the pressure in the chamber 40 by reading one or more conventional pressure nanometers connected to the chamber, compare the measure value(s) to the target pressure, obtain PID (proportional, integral, and differential) values from a stored pressure table corresponding to the target pressure, and adjust the throttle valve according to the PID values obtained from the pressure table. Alternatively, the pressure control subroutine 147 can be written to open or close the throttle valve to a particular opening size to regulate the chamber 40 at the desired pressure.

The heater control subroutine 148 comprises program code for controlling the temperature of the heater 80 used to heat the substrate. The heater control subroutine 148 includes seeding stage heating program code 158 for operating in a seeding stage in which the substrate is maintained at a desired seeding temperatures $T_s$ within the range of temperatures $\Delta T_s$. Typically, the subroutine 148 is programmed to ramp up the temperature of the support from ambient chamber temperatures to a set point temperature. When the substrate reaches the seeding temperatures $T_s$, the process gas control subroutine 146 is programmed to introduce seeding gas into the chamber, as described above. The heater control subroutine 148 also comprises epitaxial growth heating program code 160 for rapidly heating the substrate to deposition temperatures $T_d$ within a range of temperatures $\Delta T_D$ that are suitable for growing an epitaxial growth layer on the seeding layer. In this step, the heater control subroutine 148 is invoked by the chamber manager subroutine 144a and receives a ramp rate temperature parameter of at least about 50° C./min.

The heater control subroutine 148 measures temperature by measuring voltage output of a thermocouple located in the support, compares the measured temperature to the setpoint temperature, and increases or decreases current applied to the heater 80 to obtain the desired ramp rate or setpoint temperature. The temperature is obtained from the measured voltage by looking up the corresponding temperature in a stored conversion table, or by calculating the temperature using a fourth order polynomial. When radiant lamps are used as the heater 80, the heater control subroutine 148 gradually controls a ramp up/down of current applied to the lamp that increases the life and reliability of the lamp. Additionally, a built-in fail-safe mode can be included to detect process safety compliance, and to shut down operation of the heater 80 if the process chamber 40 is not properly set up.

The plasma control subroutine 149 comprises program code for forming a deposition plasma in the chamber during operation of the chamber in a chemical vapor deposition mode. The subroutine 149 sets the RF bias voltage power level applied to the process electrodes 60, 65 in the chamber 40, and optionally sets the level of the magnetic field generated in the chamber, to form the deposition plasma. Similar to the previously described chamber component subroutines, the plasma control subroutine 149 is invoked by the chamber manager subroutine 144a. In operation, the plasma condition 149 includes steps for reading both "forward" power applied to the plasma generator 116, and "reflected" power flowing through the chamber 40. An excessively high reflected power reading indicates that the plasma has not been ignite, and the plasma control subroutine 149 restarts or shuts down the process. The read power levels are compared against target levels, and the current is adjusted to control the plasma for applying a sinusoidal wave current to the generator to form a rotating magnetic field in the chamber 40. The sinusoidal wave needed to generate a desired magnetic field can be obtained from a stored table of sinusoidal values corresponding to magnetic field strengths, or calculated using a sinusoidal equation.

EXAMPLE 1

One example of the present invention was performed using an ENDURA® platform available from Applied Materials, Inc., having a PVD coherent titanium chamber, a PVD TiN chamber, a CVD Al chamber and a PVD Al chamber. A silicon wafer having a sub 0.30 µm via having an aspect ratio ≧4:1 was introduced into the system. About 400 Å of titanium was deposited on the patterned wafer in the Coh-Ti chamber. The Ti serves as a getter material for native oxides formed on the bottom of the interconnect. Next, the wafer was moved into the TiN chamber where 150 Å of TiN was deposited on the Ti layer to serve as the nucleation layer. Next, the wafer was moved into the CVD Al chamber where 450 Å of Al was deposited on the TiN. Finally, the wafer was moved into the PVD Al chamber where 5500 Å of Al was deposited using 2kW of power and the wafer temperature was about 400° C. Electron micrographs show good step coverage and void free via-fill.

While the foregoing is directed to the preferred embodiment of the present invention, other and further embodiments of the invention may be devised without departing from the basic scope thereof. The scope of the invention is determined by the claims which follow.

What is claimed is:

1. A method for processing a substrate, comprising:
   (a) introducing the substrate into a first process zone;
   (b) depositing a dis-continuous nucleation layer having scattered nucleation sites within vias on the substrate;
   (c) introducing the substrate into a second process zone;
   (d) depositing a wetting layer on the dis-continuous nucleation layer;
   (e) introducing the substrate into a third process zone; and
   (f) depositing a conducting laster on the wretting layer.

2. The method of claim 1, wherein the depositing a dis-continuous nucleation layer comprises depositing a dis-continuous layer selected from the group consisting of Ti, TiN, Ta, TaN, Al, Cu, TDMAT, and combinations thereof.

3. The method of claim 2, wherein the dis-continuous nucleation layer is deposited by physical vapor depositing a dis-continuous layer selected from the group consisting of Ti, TiN, Ta, TaN, Al, Cu, and combinations thereof.

4. The method of claim 3, wherein the wetting layer is comprised of a material selected from the group consisting of Al, Cu, and combinations thereof.

5. The method of claim 1, wherein the dis-continuous nucleation layer is comprised of a material selected from the group consisting of Ti, TiN, Al, Cu, Si, Nb, Ta, TaN, aluminum silicates, silica, high alumina, and combinations thereof.

6. The method of claim 1, wherein the depositing a conducting layer comprises depositing a metal layer by physical vapor deposition over a chemical vapor deposited conducting layer.

7. The method of claim 6, wherein the metal layer is deposited at a temperature greater than about 250° C.

8. A method for filling vias on a substrate, comprising:
   depositing a discontinuous nucleation layer having scattered nucleation sites within the vias;
   depositing a wetting layer on the nucleation layer; and then
   depositing a conducting layer on the wetting layer.

9. The method of claim 8, wherein the dis-continuous nucleation layer is comprised of a material selected from the group consisting of Ti, TiN, Al, Cu, Si, Nb, Ta, TaN, aluminum silicates, silica, high alumina, and combinations thereof.

10. The method of claim 9, wherein the wetting layer is comprised of a material selected from the group consisting of Al, Cu, and combinations thereof.

11. The method of claim 9, wherein the discontinuous nucleation layer is comprised of Ti having a thickness a few atoms to about 500Å and TiN having a thickness of a few atoms to about 300 Å.

12. The method of claim 11, wherein the wetting layer comprises a material selected from the group consisting of Al, Cu, and combinations thereof, and the wetting layer has a thickness of about 50Å to about 500 Å.

13. The method of claim 8, wherein the conducting layer is a metal layer.

14. The method of claim 13, wherein the metal layer is comprised of a material selected from the group consisting of Al, Cu, and combinations thereof.

15. The method of claim 14, wherein the metal layer is deposited at a temperature of greater than about 250° C.

16. The method of claim 1, wherein the wetting layer conforms to the vias.

17. The method of claim 16, wherein the conducting layer fills the vias.

18. The method of claim 8, wherein the wetting layer conforms to the vias.

19. The method of claim 18, wherein the conducting layer fills the vias.

* * * * *

UNITED STATES PATENT AND TRADEMARK OFFICE
CERTIFICATE OF CORRECTION

PATENT NO    : 6,139,905

DATED        : October 31, 2000

INVENTOR(S)  : Chen et al.

It is certified that error appears in the above-identified patent and that said Letters Patent are hereby corrected as shown below:

In column 8, line 30, please delete " -**" .

In column 13, line 16, please replace " wretting" with " wetting" .

Signed and Sealed this

Fifteenth Day of May, 2001

*Attest:*

NICHOLAS P. GODICI

*Attesting Officer*   Acting Director of the United States Patent and Trademark Office